(12) United States Patent
Pendse et al.

(10) Patent No.: US 6,737,295 B2
(45) Date of Patent: May 18, 2004

(54) CHIP SCALE PACKAGE WITH FLIP CHIP INTERCONNECT

(75) Inventors: Rajendra Pendse, Fremont, CA (US); Nazir Ahmad, San Jose, CA (US); Andrea Chen, San Jose, CA (US); Kyung-Moon Kim, Ichon-si (KR); Young Do Kweon, Cupertino, CA (US); Samuel Tam, Daly City, CA (US)

(73) Assignee: ChipPAC, Inc., Fremont, CA (US)

( * ) Notice: Subject to any disclaimer, the term of this patent is extended or adjusted under 35 U.S.C. 154(b) by 0 days.

(21) Appl. No.: 10/081,491

(22) Filed: Feb. 22, 2002

(65) Prior Publication Data

US 2002/0151189 A1 Oct. 17, 2002

Related U.S. Application Data

(60) Provisional application No. 60/272,237, filed on Feb. 27, 2001.

(51) Int. Cl.[7] .................. H01L 21/44; H01L 21/48; H01L 21/50
(52) U.S. Cl. .................. 438/106; 438/108; 257/778
(58) Field of Search .................. 438/108; 257/738, 257/778

(56) References Cited

U.S. PATENT DOCUMENTS

| | | | |
|---|---|---|---|
| 4,208,005 A | 6/1980 | Nate et al. | |
| 5,210,938 A | 5/1993 | Hirai | |
| 5,250,469 A | 10/1993 | Tanaka et al. | |
| 5,346,857 A | 9/1994 | Scharr et al. | |
| 5,386,624 A | 2/1995 | George et al. | |
| 5,450,283 A | * 9/1995 | Lin et al. ............ | 361/704 |
| 5,508,561 A | 4/1996 | Tago et al. | |
| 5,592,736 A | 1/1997 | Akram et al. | |
| 5,686,317 A | 11/1997 | Akram et al. | |
| 5,717,477 A | 2/1998 | Fritz et al. | |
| 5,801,350 A | 9/1998 | Shibuya et al. | |
| 5,829,126 A | 11/1998 | Nagao et al. | |
| 5,865,365 A | 2/1999 | Nishikawa et al. | |
| 5,869,904 A | 2/1999 | Shoji | |
| 5,874,780 A | 2/1999 | Murakami | |
| 5,892,289 A | 4/1999 | Tokuno | |
| 5,931,371 A | 8/1999 | Pao et al. | |
| 5,953,814 A | 9/1999 | Sozansky et al. | |
| 5,956,605 A | * 9/1999 | Akram et al. ............ | 438/613 |
| 5,981,313 A | * 11/1999 | Tanaka ............ | 438/118 |
| 6,037,192 A | 3/2000 | Witzman et al. | |
| 6,075,710 A | 6/2000 | Lau | |
| 6,130,476 A | 10/2000 | LaFontaine, Jr. et al. | |
| 6,137,164 A | 10/2000 | Yew et al. | |
| 6,153,940 A | 11/2000 | Zakel et al. | |
| 6,173,887 B1 | 1/2001 | Mead et al. | |
| 6,184,061 B1 | 2/2001 | Wu et al. | |
| 6,191,952 B1 | * 2/2001 | Jimarez et al. ............ | 361/771 |
| 6,214,642 B1 | 4/2001 | Chen et al. | |
| 6,225,144 B1 | 5/2001 | How et al. | |

(List continued on next page.)

*Primary Examiner*—John F. Niebling
*Assistant Examiner*—Angel Roman
(74) *Attorney, Agent, or Firm*—Bill Kennedy; Haynes Beffel & Wolfeld LLP

(57) ABSTRACT

A flip chip package is formed by a solid-state bond technique for connecting the input/output pads on the integrated circuit chip and the package substrate. The solid-state bond technique involves a direct mating of metal surfaces, and does not employ any particulate conductive material nor any melting or flow of any interconnecting material. Accordingly the connections can be formed at very fine geometries. In another aspect, the space between the surface of the integrated circuit chip and the subjacent surface of the package substrate is filled with a patterned adhesive structure, which consists of one or more adhesive materials that are deployed in a specified pattern in relation to the positions of the second level interconnections between the package and the printed circuit board.

14 Claims, 1 Drawing Sheet

U.S. PATENT DOCUMENTS

| | | |
|---|---|---|
| 6,255,140 B1 | 7/2001 | Wang |
| 6,294,405 B1 | 9/2001 | Higgins, III |
| 6,326,234 B1 | 12/2001 | Nakamura |
| 6,335,571 B1 * | 1/2002 | Capote et al. ............... 257/787 |
| 6,337,522 B1 | 1/2002 | Kang et al. |
| 6,339,254 B1 | 1/2002 | Venkateshwaran et al. |
| 6,350,669 B1 * | 2/2002 | Pu et al. ...................... 438/613 |
| 6,365,500 B1 * | 4/2002 | Chang et al. ................ 438/614 |
| 6,387,714 B1 * | 5/2002 | Farnworth et al. ............ 438/15 |
| 6,432,744 B1 * | 8/2002 | Amador et al. .............. 438/108 |
| 6,460,591 B1 * | 10/2002 | Gotoh et al. ................. 156/359 |
| 2001/0018230 A1 * | 8/2001 | Jimarez et al. .............. 438/108 |

* cited by examiner

CHIP SCALE PACKAGE WITH FLIP CHIP INTERCONNECT

CROSS REFERENCE TO RELATED APPLICATION

This application claims priority from Provisional Application No. 60/272,237, filed Feb. 27, 2001.

BACKGROUND

This invention relates to high performance semiconductor device packaging and, particularly, to chip scale packages having flip chip interconnection.

So-called chip scale packages have come into increasing use particularly, by virtue of their very small size, for packaging integrated circuit chips in handheld or portable electronic applications. Wire bonding has been the most widely used technique for interconnecting the input/output pads of the integrated circuit chip with the package.

Flip chip interconnection is considered a promising alternative to wire bonding, in view of the potential of flip chip interconnection to provide further decrease in the package size, and in view of the higher electronic performance that flip chip interconnection can provide.

Various techniques of flip chip interconnection have been proposed for use in chip scale packages. These include interconnection by solder reflow, and "particulate" interconnection easing anisotropic conductive adhesives "ACAs" or isotropic conductive adhesives "ICAs". Each of these techniques presents challenges.

The technique of solder reflow interconnection inherently employs a melting and flow of the interconnect material, and this presents difficulties in forming interconnects at very fine geometries. In particular, as a practical matter currently the smallest interconnection pitch for solder reflow interconnection is of the order of 160 micrometers. It is desirable for very small size packaging to reliably form interconnects at finer geometries than this pitch permits.

In particulate interconnect techniques, whether ACAs or ICAs, conductive particles, such as particles of nickel, of a gold-coated polymer, or of silver, are held by mechanical pressure to form the interconnect. Generally, particulate interconnect structures are incapable of carrying high electrical currents, and they lack long-term reliability because of the particulate nature of the interconnection.

Chip scale packages employing flip chip interconnection generally are plagued by poor long-term reliability of the connections between the chip scale package and the printed circuit board to which they are attached to form the electronic subassembly, the so-called second level interconnections. This problem arises from the fact that the second level interconnections typically are located in the shadow of the integrated circuit chip, in order to achieve miniaturization. As a result of this configuration, there is a large mismatch in the effective coefficient of thermal expansion of the chip scale package and the printed circuit board, and this causes excessive stress in the interconnections and may eventually lead to failure of the interconnections by mechanical fatigue over time.

A chip scale package is desired that provides the advantages of flip chip interconnection while avoiding the disadvantages presented by conventional package configurations.

SUMMARY

According to the invention, a flip chip package features a solid-state bond technique for connecting the input/output pads on the integrated circuit chip and the package substrate. The solid-state bond technique involves a direct mating of metal surfaces, and does not employ any particulate conductive material. Accordingly the connections are capable of carrying very high current, and display good long-term reliability as compared to ACA or ICA particulate interconnects. Moreover the solid-state bond technique does not entail a melting or flow of any interconnecting material. Accordingly the connections can be formed at very fine geometries, typically as low as 70 micrometers pitch.

Also according to the invention, the space between the surface of the integrated circuit chip and the subjacent surface of the package substrate is filled with a patterned adhesive structure, which consists of one or more adhesive materials that are deployed in a specified pattern in relation to the positions of the second level interconnections between the package and the printed circuit board. According to this aspect of the invention, the coefficient of thermal expansion and the compliancy of the package structure in the regions overlying the second level connections can be tailored to reduce potentially damaging propagation of stress generated in the second level connections on the package to features on the integrated circuit chip, and thereby extending the long-term reliability of the package and of the interconnects.

In one general aspect, therefore, the invention features a flip chip package including an integrated circuit chip having interconnect bumps formed on input/output pads in a specified arrangement, and a package substrate having a plurality of bond pads in a complementary arrangement. The interconnect between the bumps on the integrated circuit chip and the respective bond pads on the package substrate is established by direct mating of the bump surfaces with the respective bond pads and thermo-mechanical deformation of the bumps. The thermo-mechanical process entails heating while forcing the bump against the pad.

In some embodiments the bump is constructed of a material or combination of materials selected to provide low yield strength, high ductility, and an oxidation- and corrosion-resistant surface. In some embodiments the bumps are formed of gold or a gold alloy. In some embodiments the bumps are formed on the input/output pads of the integrated circuit chip by a "stud bumping" or a "solder bumping" or an electroplating process, In another general aspect, the invention features a method for forming a flip chip package, by: providing an integrated circuit chip having interconnect bumps formed on input/output pads in a specified arrangement, each interconnect bump having low yield strength, high ductility, and an oxidation- and corrosion-resistant surface; providing a package substrate having a plurality of bond pads in an arrangement complementary to the specified arrangement of input/output pads on the integrated circuit chip; contacting the bumps with the respective bond pads on the package substrate; and thermo-mechanically treating the bumps to form solid-state connections of the bumps with their respective bond pads.

In some embodiments, the thermo-mechanically treating step includes concurrently heating and applying a force between the bumps and the pads. Usually the bump and pad are heated to a temperature in the range about 150° C. to about 300° C., typically about 240° C. for a gold bump; and the force is provided by weighting with a mass in the range about 25 grams to about 150 grams per bump, typically about 50 grams per bump for gold bumps.

In another general aspect, the invention features a flip chip package configured for second level interconnection to a printed circuit board by way of interconnect structures formed in the shadow of the chip. According to this aspect of the invention, a flip chip package includes an integrated circuit chip having interconnect bumps formed on input/output pads in a specified arrangement in a surface of the chip, and a package substrate having a plurality of bond pads in a complementary arrangement in a subjacent surface of the package substrate. In preferred embodiments the chip-to-package interconnect bumps are bonded to the respective bonding pads in a solid-state manner. Second level interconnect sites are arranged in a second surface of the package substrate, and second level interconnect structures are connected to the respective second level interconnect sites. Between the integrated circuit chip and the package substrate is a fill volume, which is at least partly filled with one or more fill materials each having a selected specific elastic modulus, including a lower elastic modulus material in regions of the fill volume that overlie the second level interconnect sites.

In some embodiments, the fill volume includes a first fill zone made up of a plurality of generally columnar volumes, generally overlying the plurality of second level interconnect sites, and the second fill zone constituting the remainder of the fill volume. In some embodiments, at least a part of the first fill zone contains a first material having a lower specific elastic modulus, and at least a part of the second fill zone contains a second material having a comparatively high specific elastic modulus. In some such embodiments the first fill material has a specific elastic modulus less than about 0.5 GPa; and the second fill material has a specific elastic modulus greater than about 5 GPa, usually in the range about 5 GPa to about 15 GPa. In some embodiments the second fill material includes an epoxy, such as an anhydride curable epoxy. In some embodiments the second material is deployed in a patterned filling substantially only the second fill zone, so that in the assembled package the generally columnar volumes of the first fill zone constitute voids in the fill material within the fill volume. In other embodiments the first fill material includes an adhesive, such as a silicon adhesive.

In another general aspect, the invention features a method for making a flip chip package configured for interconnection to a printed circuit board, by: providing an integrated circuit chip having a surface; providing a package substrate having a first surface and a second surface, the second surface being provided with a plurality of second level interconnect sites, the locations of the second level interconnect sites defining a plurality of first fill zone areas over the first surface of the package substrate, the remainder of the first surface of the package substrate constituting a second fill zone area; dispensing at least a second fill material, having a specific elastic modulus greater than about 5 GPa, and usually in the range about 5 GPa to about 15 GPa, within the second fill zone area on the first surface of the package substrate; and assembling the integrated circuit chip and the package substrate so that the second fill material is confined in a second fill zone within a volume defined between the integrated circuit chip surface and the first surface of the package substrate. In some embodiments the method for includes, prior to assembling the package, dispensing a first fill material, having a specific elastic modulus less than about 0.5 GPa within the first fill zone area on the first surface of the package substrate. In some embodiments, the fill material dispensing includes deposition, for example by syringe; sheet lamination; and printing, including screen printing.

BRIEF DESCRIPTION OF THE DRAWING

The FIGURE is a diagrammatic sketch in a sectional view showing an embodiment of a chip package according to the invention.

DETAILED DESCRIPTION

Figure 1:
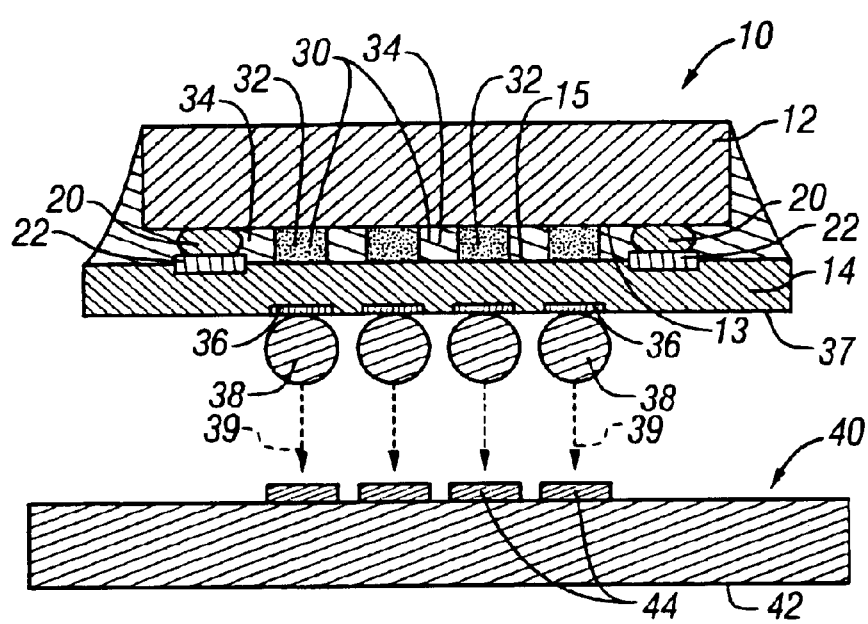

The invention will now be described in further detail by reference to the drawing, which illustrates an embodiment of the invention. The drawing is diagrammatic, showing features of the invention and their relation to other features and structures, and is not made to scale. For improved clarity of presentation, certain details of conventional aspects of the structure of the device illustrated, not necessary to an understanding of the invention, are omitted from the drawing.

Turning now to the FIGURE, there is shown in a diagrammatic sectional view a flip chip package according to the invention generally at 10 positioned over a conventional printed circuit board generally at 40 to which the flip chip package is to be attached by way of second level connections. Printed circuit board 40 includes, among other structures not shown in the FIGURE, a substrate 42 and a plurality of second level interconnect pads, for example 44.

Flip chip package 10 includes integrated circuit chip 12 interconnected with package substrate 14. The chip-to-package substrate interconnection is made by way of interconnect bumps 20 formed on a specified arrangement of input/output pads (not shown in the FIGURE) in a surface 13 of the integrated circuit chip 12, and corresponding bonding pads 22 in a specified complementary arrangement in a subjacent surface 15 of the package substrate 14. The interconnect bumps 20 are formed on the input/output pads by a conventional technique, such as by stud bumping or solder bumping or electroplating.

According to the invention, the interconnect bumps 20 are bonded to the respective bonding pads 22 in a solid-state manner. That is to say, the interconnect bumps 20 are formed of a non particulate conductive material having low yield strength and high ductility and providing an oxidation- and corrosion-resistant surface; and the bond is formed by mating the bumps 20 with the respective bonding pads 22 and thermo-mechanically deforming the bumps on the pads. The thermo-mechanical deformation is carried out by concurrently heating and applying a force between the bumps and the pads. Usually the bump and pad are heated to a temperature in the range about 150° C. to about 300° C., and the force is provided by weighting with a mass in the range about 25 grams to about 150 grams per bump. Where the bumps are of gold, for example, a satisfactory solid state connection of the bump and pad can be achieved by heating to a temperature about 240° C. and weighting with a mass about 50 grams per bump. Preferably the bumps are formed of gold or a gold alloy, but other materials may be used, provided they are non particulate and conductive, and have sufficient characteristics of yield strength and ductility to form an adequate bond with the bonding pads by the thermo-mechanical process.

Connection of the flip chip package 10 to the printed circuit board 40 is made by way of bumps or balls, for example 38, which are attached to second level interconnect sites, for example 36, in a second surface 37 of the flip chip package substrate 14. As the flip chip package 10 is moved toward the printed circuit board 40 (as illustrated by arrows 39) and the second level interconnect balls 38 are pressed against the respective second level interconnect pads 44 and processed to complete the connection, forces generated in the second level interconnect are propagated upward into the package substrate, localized particularly near the interconnect sites 36. Moreover, in the completed device, differences between the thermal expansion coefficients of elements of the secondary interconnection and of elements of the package can result in stresses caused by differential expansion of the various part during thermal cycles of the device while in use. These forces and stresses can cause failures, particularly in interconnect structures. These deleterious effects of these are mitigated according to the invention by providing for dispersion of the forces and stresses in the fill volume between the chip and the package substrate.

Between the integrated circuit chip 12 and the package substrate 14 is a fill volume 30, generally defined as the volume between the surface 13 of the integrated circuit chip 12 and the subjacent surface 15 of the package substrate 14.

According to the invention, a material deployed within the fill volume 30 has a selected specific elastic modulus and, particularly according to the invention, the fill volume is filled with one or more materials including a lower elastic modulus material in regions of the fill volume that overlie the second level interconnect sites. As a result the package has greater compliance, at least in the regions over the second level interconnect sites, so that forces resulting from movement of or differential thermal expansion or contraction near the second level interconnect sites are not directly translated upward or laterally through the fill volume. Stated another way, the lower modulus material provides for distribution over a wider and less focused area of stresses directed upward through the printed circuit board from the underlying second level interconnect sites. This reduces localized stresses on the various parts of the package during manufacture and heat cycling, and improves manufacturing yield and reliability.

Accordingly, the fill volume 30 includes a first fill zone made up of a plurality of generally columnar volumes, for example 32, generally overlying the plurality of second level interconnect sites, for example 36, and a second fill zone constituting the remainder of the fill volume 30, for example 34, and including the regions of the bumps and pads 20, 22.

In some embodiments of the invention at least a part of the first fill zone (that is, at least a portion of the columnar volumes 32) contains a first material having a comparatively low specific elastic modulus, typically less than about 0.5 GPa; and at least a part of the second fill zone contains a second material having a comparatively high specific elastic modulus, typically greater than about 5 GPa, and usually in the range about 5 GPa to about 15 GPa. In some embodiments, no material is deployed within the first fill zone; that is, the second material is deployed in a pattern filling substantially only the second fill zone 34, so that when the package is assembled the columnar volumes 32 constitute voids in the second fill material within the fill volume 30. Stated another way, in such embodiments the first fill material constitutes whatever mixture of gases (which may be air) is present in the voids in the patterned second material at the time of assembly of the chip onto the substrate. More usually, according to this aspect of the invention, at least a part of the first fill zone (that is, at least a portion of the columnar volumes 32) contains an adhesive having a low specific elastic modulus, such as a silicone adhesive. Adhesives suitable for use as a first material may have a specific elastic modulus about 0.4 GP for example. In such embodiments the second fill material may be an epoxy, such as for example an anhydride curing epoxy.

Usually, the fill material or fill materials are applied onto the first surface of the substrate prior to assembly of the integrated circuit chip onto the substrate. This may be particularly advantageous where the fill materials include a heat-curable fill material. That is, the non cured fill material is applied onto the substrate, and thereafter the interconnect bumps on the integrated circuit chip are mated to their corresponding pads on the substrate, displacing any fill material between the bumps and the pads. Then the curing of the adhesive occurs concurrently with the formation of the interconnect bonds.

The patterned deployment of the fill material or fill materials according to the invention can be carried out using any of a variety of methods, including screen printing, and dispensing by syringe, sheet lamination, or other methods, or combinations of these. Particularly, for example, where only a second fill material is deployed (and the first fill zone constitute voids), the second fill material may be screen printed in the desired pattern on the first surface of the substrate prior to assembly of the integrated circuit chip onto the package substrate. And, where a low specific elastic modulus adhesive such as a silicone adhesive is used as a first fill material, the silicone adhesive can be spot deposited onto the first surface of the substrate, for example by syringe, and then second fill material can be applied by screen printing to fill the second fill zone around the first fill material.

In other embodiments of the invention at least a part of the second fill zone and of the first fill zone contain a fill material having an intermediate specific elastic modulus, typically in the range about 1 GPa to about 5 GPa or, in some embodiments, as high as about 10 GPa.

EXAMPLE 1

Dimensions of the columnar volumes constituting the first fill zone.

As described generally above, the first fill zone is generally defined as being made up of regions of the fill volume that overly the second level interconnect sites. The second level interconnect sites are, typically, roughly circular pads on the second surface of the substrate. A projection of the circular outline of such a second level interconnect pad is toward the integrated circuit chip in a direction roughly normal to the substrate surface defines a roughly cylindrical boundary within the fill volume overlying the second level interconnect pad. A "region of the fill volume that overlies a second level interconnect site", as that expression is used herein, is a portion of the fill volume that contains at least 90 percent of, and more usually 100 percent of, the volume contained within this cylindrical boundary; and usually a "region of the fill volume that overlies a second level interconnect site" has itself a generally cylindrical shape whose cross-section at any point within the region contains at least 90 percent of, and more usually 100 percent of, the area of a cross-section of this cylindrical boundary; and usually the circumference of such a cross-section of a "region of the fill volume that overlies a second level interconnect site" is roughly a circle that does not extend substantially outside the cross section of the cylindrical boundary by a distance greater than about 10 percent of the diameter of the cylindrical boundary.

In this Example, the second level interconnects in a chip scale package according to the invention is constructed having dimensions as follows: the ball-to-ball pitch is about 0.75 mm; the second level contact pad diameter is about 0.35 mm; and the diameter of the nominally cylindrical region of the fill volume overlying the second level interconnect site is about 0.4 mm.

EXAMPLE 2

Selected first and second fill materials.

This example illustrates construction of chip scale packages having various combinations of fill materials and the first and second fill zones. Particularly, in a first configuration, according to the invention, a second fill material having a specific elastic modulus about 7.5 GPa was employed together with a first fill material having a specific elastic modulus about 0.4 GPa; in a second configuration, also according to the invention, a second fill material having a specific elastic modulus about 7.5 GPa was employed and the second fill zone was left void (having a specific elastic modulus of 0); and in a third configuration, substantially the entire fill volume was filled with a fill material having a specific elastic modulus about 7.5 GPa, as in a conventional package.

EXAMPLE 3

Thermal cycling of chip scale packages configured as in example 2.

Chip scale package is constructed as an example 2 were subjected to a standardized test of thermal stress. Particularly, the devices were tested for electrical continuity while being subjected to a repeated temperature cycle consisting of a ramp up from 0° C. to 100° C. over a 10 minute period, followed by a dwell for a 10 minute period at 100° C., followed by a ramp down from 100° C. to 0° C. over a 10 minute period, followed by a dwell for a 10 minute period at 0° C.

Generally, the packages according to the invention survived longer in this test than the conventional package (about 30% longer), and packages according to the invention having substantially no fill material in the first fill zone survived longer in this test (about 20% longer) than the packages having a low specific elastic modulus adhesive in the first fill zone.

Other embodiments are within the following claims.

What is claimed is:

1. A flip chip package, comprising
an integrated circuit chip having interconnect bumps formed on input/output pads in a specified arrangement in a surface thereof, and a package substrate having a plurality of bond pads in a complementary arrangement in a subjacent surface of the package substrate, wherein
second level interconnect sites are arranged in a second surface of the package substrate, and second level interconnect structures are connected to the respective second level interconnect sites, and wherein
a fill volume is defined between the integrated circuit chip and the package substrate, the fill volume being at least partly filled with at least one fill material, each said fill material having a selected specific elastic modulus, wherein regions of the fill volume that overlie the second level interconnect sites contain a lower specific elastic modulus fill material.

2. The flip chip package of claim 1 wherein the fill volume includes a first fill zone comprising a plurality of generally columnar volumes, generally overlying the plurality of second level interconnect sites; and the second fill zone consists of the remainder of the fill volume.

3. The flip chip package of claim 2 wherein at least a part of the first fill zone contains a first material having a lower specific elastic modulus, and at least a part of the second fill zone contains a second material having a higher specific elastic modulus.

4. The flip chip package of claim 3 wherein the first fill material has a specific elastic modulus less than about 0.5 GPa.

5. The flip chip package of claim 3 wherein the second fill material has a specific elastic modulus greater than about 5 GPa.

6. The flip chip package of claim 5 wherein the second fill material has a specific elastic modulus in a range about 5 GPa to about 15 GPa.

7. The flip chip package of claim 3 wherein the second fill material comprises an epoxy.

8. The flip chip package of claim 7 wherein the second fill material comprises an anhydride curable epoxy.

9. The flip chip package of claim 3 wherein the first fill zone comprises voids in the fill material within the fill volume.

10. The flip chip package of claim 3 wherein the first fill material comprises an adhesive.

11. The flip chip package of claim 10 wherein the first fill material comprises a silicon adhesive.

12. A method for making a flip chip package configured for interconnection to a printed circuit board, comprising
providing an integrated circuit chip having a surface;
providing a package substrate having a first surface and a second surface, the second surface being provided with a plurality of second level interconnect sites, the locations of the second level interconnect sites defining a plurality of first fill zone areas over the first surface of the package substrate, the remainder of the first surface of the package substrate constituting a second fill zone area;
dispensing at least a second fill material, having a specific elastic modulus greater than about 5 GPa, within the second fill zone area on the first surface of the package substrate; and
assembling the integrated circuit chip and the package substrate so that the second fill material is confined in a second fill zone within a volume defined between the integrated circuit chip surface and the first surface of the package substrate.

13. The method of claim 12 wherein the second fill material has a specific elastic modulus in a range about 5 GPa to about 15 GPa.

14. The method of claim 12, further comprising, prior to assembling the package, dispensing a first fill material having a specific elastic modulus less than about 0.5 GPa within the first fill zone area on the first surface of the package substrate.

* * * * *